(12) United States Patent
Ogawa

(10) Patent No.: US 9,275,749 B1
(45) Date of Patent: Mar. 1, 2016

(54) INTERNAL POWER VOLTAGE GENERATING CIRCUIT, SEMICONDUCTOR MEMORY DEVICE AND SEMICONDUCTOR DEVICE

(71) Applicant: Powerchip Technology Corporation, Hsinchu (TW)

(72) Inventor: Akira Ogawa, Tokyo (JP)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/718,101

(22) Filed: May 21, 2015

(30) Foreign Application Priority Data

Nov. 14, 2014 (JP) .................................. 2014-231960

(51) Int. Cl.
| | |
|---|---|
| G11C 7/00 | (2006.01) |
| G11C 16/30 | (2006.01) |
| H03K 3/012 | (2006.01) |
| H03K 17/687 | (2006.01) |
| G11C 5/14 | (2006.01) |
| G11C 7/22 | (2006.01) |
| H03K 5/24 | (2006.01) |

(52) U.S. Cl.
CPC ................ *G11C 16/30* (2013.01); *G11C 5/147* (2013.01); *G11C 7/22* (2013.01); *H03K 3/012* (2013.01); *H03K 5/2481* (2013.01); *H03K 17/687* (2013.01)

(58) Field of Classification Search
CPC .... H02M 3/07; H02M 3/33569; G11C 16/30; G11C 7/062; G11C 29/12005; H03K 5/2481; H03L 7/093
USPC ........ 365/189.09, 226, 189.07; 327/156–157, 327/541
See application file for complete search history.

(56) References Cited

U.S. PATENT DOCUMENTS 9,000,837 B1 * 4/2015 Fifield .................. G11C 29/028
                                             327/306

FOREIGN PATENT DOCUMENTS

| JP | 08-190437 | 7/1996 |
|---|---|---|
| JP | 2005024502 | 1/2005 |
| JP | 2005174351 | 6/2005 |
| JP | 2009503705 | 1/2009 |
| JP | 2014010877 | 1/2014 |

* cited by examiner

*Primary Examiner* — David Lam
(74) *Attorney, Agent, or Firm* — Jiang Chyun Intellectual Property Office

(57) ABSTRACT

The invention is an internal power voltage generating circuit, adjusted such that an internal power voltage becomes the reference voltage. The internal power voltage generating circuit further includes: a charge share circuit, including a charging capacitor, an initial voltage adjusting circuit and a charge reset circuit. The charging capacitor is connected to a differential amplifier via a switch circuit, and is charged by charges of a control voltage. The initial voltage adjusting circuit adjusts and applies an initial voltage to the charging capacitor. The charge reset circuit discharges the charging capacitor. When the internal power voltage is lower than a reference voltage, the charging capacitor having the initial voltage is connected to the differential amplifier, and the charges of the control voltage are transferred to the charging capacitor during a transfer period.

18 Claims, 12 Drawing Sheets

INTERNAL POWER VOLTAGE GENERATING CIRCUIT, SEMICONDUCTOR MEMORY DEVICE AND SEMICONDUCTOR DEVICE

CROSS-REFERENCE TO RELATED APPLICATION

This application claims the priority benefit of Japan application serial no. 2014-231960, filed on Nov. 14, 2014. The entirety of the above-mentioned patent application is hereby incorporated by reference herein and made a part of this specification.

BACKGROUND OF THE INVENTION

1. Field of the Invention

The invention relates to an internal power voltage generating circuit for, e.g., a semiconductor memory device or a semiconductor device, as well as to a semiconductor memory device and a semiconductor device that have the internal power voltage generating circuit.

2. Description of Related Art

A non-volatile memory device using the Fowler-Nordheim (FN) tunneling effect, such as a flash memory, requires a predetermined high voltage (HV) for writing (programming) or erasing data. In this case, due to efficiency issues of a charge pump circuit, it is very difficult to decrease an external power voltage VCC. Therefore, an internal power voltage VDD is generated from the external power voltage VCC and is applied in peripheral circuits of the memory device. However, at this moment, it is necessary to adjust the internal power voltage VDD to an appropriate operating voltage range of peripheral metal-oxide-semiconductor (MOS) transistors. For example, in a NAND flash memory, an internal power voltage VDD of 2 to 2.3 V is usually generated (e.g., see Patent Document 1).

PRIOR-ART DOCUMENTS

Patent Documents

Patent Document 1: Japan Laid-Open No. 2014-010877
Patent Document 2: Japan Laid-Open No. H08-190437
Patent Document 3: Japan Laid-Open No. 2005-174351
Patent Document 4: Japan Laid-Open No. 2005-024502
Patent Document 5: Japan Laid-Open No. 2009-503705

SUMMARY OF THE INVENTION

FIG. 13 is a circuit diagram showing a structure of an internal power voltage adjusting circuit 40 according to a conventional example (e.g., see Patent Documents 2 to 4, etc.). In FIG. 13, the internal power voltage adjusting circuit 40 includes a differential amplifier 51, a P-channel MOS transistor P1 as a driving transistor, and a phase compensating circuit 54.

In the internal power voltage adjusting circuit 40 in FIG. 13, a reference voltage VDDREF is inputted to an inverting input terminal of the differential amplifier 51. An internal power voltage VDD outputted from the P-channel MOS transistor P1 connected to an external power voltage VCC is inputted to a non-inverting input terminal of the differential amplifier 51. A control voltage (comparison result voltage) from an output terminal of the differential amplifier 51 is applied to a gate of the P-channel MOS transistor P1 via a connection point 55. In addition, the connection point 55 is connected to the phase compensating circuit 54 having a series circuit of a resistor Rp and a capacitor Cp, and a voltage at the connection point 55 is DRVP. In the internal power voltage adjusting circuit 40 configured as above, based on the reference voltage VDDREF, the predetermined internal power voltage VDD is generated from the external power voltage VCC and maintained, and each circuit (load circuit) 53 in a non-volatile memory device is supplied with a power current iVDD.

An ordinary NAND flash memory uses single data rate (SDR) in a reading mode. However, flash memory products that use double data rate (DDR) for reading have recently been introduced, and it is expected that they will have a big market in the future. That is, in a conventional NAND flash memory using SDR, even if operations are performed by using the internal power voltage VDD generated by a conventional internal power voltage generating circuit, sufficient performance is achieved in terms of reading characteristics. However, in a NAND flash memory using DDR, data reading as described below cannot be performed.

That is, due to the high data rate, the load current iVDD when a DDR operation is performed has a very large swing as compared to when an SDR operation is performed. In other words, when the load power current iVDD flows, the internal power voltage VDD considerably drops and restoration of the level becomes slow. Here, e.g., when the load current iVDD varies in a short time, it is anticipated that the internal power voltage generating circuit cannot operate in a manner to maintain the internal power voltage VDD. A response speed of a current internal power voltage generator is about 1 μs. However, in a DDR operation, a response speed of about 10 ns is required.

The invention is intended to solve the above problems and to provide an internal power voltage generating circuit capable of reading data at high speed compared to the prior art, even in, e.g., a semiconductor memory device that reads data using DDR.

In addition, the invention is also intended to provide a semiconductor memory device and a semiconductor device that have the internal power voltage generating circuit.

An internal power voltage generating circuit according to the first invention includes: a differential amplifier, comparing an internal power voltage supplied to a load circuit with a predetermined first reference voltage and outputting from an output terminal a control voltage showing a comparison result; and a driving transistor, driving an external power voltage according to the control voltage and outputting the internal power voltage, wherein the internal power voltage generating circuit is adjusted such that the internal power voltage becomes the first reference voltage. The internal power voltage generating circuit is characterized by including:

a charge share circuit, including a charging capacitor, an initial voltage adjusting circuit and a charge reset circuit, wherein the charging capacitor is connected to the output terminal of the differential amplifier via a switch circuit, and is charged by charges of the control voltage, the initial voltage adjusting circuit adjusts and applies a predetermined initial voltage to the charging capacitor, and the charge reset circuit discharges the charging capacitor; and a control means, turning on the switch circuit when the internal power voltage is lower than a predetermined second reference voltage, thereby connecting the charging capacitor having the initial voltage to the output terminal of the differential amplifier, transferring the charges of the control voltage to the charging capacitor during a predetermined transfer period, then turning off the switch circuit, and then transferring the charges of the charging capacitor by the charge reset circuit during a predetermined reset period.

In the internal power voltage generating circuit, the initial voltage adjusting circuit generates a predetermined small current and causes a current corresponding to the small current to flow to a circuit so as to generate the initial voltage, wherein the circuit generates the predetermined initial voltage decreasing from the external power voltage.

In addition, in the internal power voltage generating circuit, the initial voltage adjusting circuit includes a predetermined number of stages of first transistors. The predetermined number of stages of first transistors are connected to the external power voltage and connected to each other in series. Moreover, the initial voltage adjusting circuit generates a voltage obtained in the following manner as the initial voltage. The voltage is obtained by subtracting, from the external power voltage, a value obtained by multiplying the predetermined number of stages by a threshold voltage of the first transistor.

Further, in the internal power voltage generating circuit, the initial voltage adjusting circuit includes a circuit formed by connecting a predetermined number of stages of second transistors, a plurality of divider resistors and a reference current source in series. The predetermined number of stages of second transistors are connected to the external power voltage and connected to each other in series. Moreover, the initial voltage adjusting circuit is a charging circuit that selectively generates, as the initial voltage, a voltage from one end of any one of the divider resistors.

Furthermore, in the internal power voltage generating circuit, the charge reset circuit includes a third transistor connected between the charging capacitor and ground. During the reset period, the third transistor is turned on, and thereby the charges of the charging capacitor are discharged.

In addition, in the internal power voltage generating circuit, the charge reset circuit is a pull-down circuit that, during the reset period, causes a predetermined small current for discharge to flow, and causes a current corresponding to the small current for discharge to flow from the charging capacitor to discharge the charges of the charging capacitor, thereby pulling down a voltage of the charging capacitor.

Further, in the internal power voltage generating circuit, during the reset period, the charge reset circuit transfers the charges of the charging capacitor in a manner that a potential of the control voltage is reduced by being set to a predetermined charging reference voltage.

Here, the second reference voltage is equal to the first reference voltage.

Furthermore, in the internal power voltage generating circuit, an overshoot prevention circuit is further included. When the internal power voltage is greater than a predetermined third reference voltage, the overshoot prevention circuit pulls up the control voltage to a predetermined voltage, thereby preventing an overshoot of the internal power voltage.

In the internal power voltage generating circuit, when the internal power voltage is greater than the predetermined third reference voltage, the overshoot prevention circuit pulls up the control voltage to a voltage decreasing from the external power voltage by a predetermined voltage via a transistor circuit, thereby preventing the overshoot of the internal power voltage.

Moreover, in the internal power voltage generating circuit, when the internal power voltage is greater than the predetermined third reference voltage, the overshoot prevention circuit connects the control voltage to a charging voltage for a predetermined period for charge sharing, thereby preventing the overshoot of the internal power voltage, wherein the charging voltage is obtained by charging the external power voltage to another charging capacitor.

Further, in the internal power voltage generating circuit, the control means includes: a comparator, comparing the internal power voltage with the second reference voltage and outputting a comparison result signal; and a timing signal generating circuit, generating a control signal that controls on or off of the switch circuit based on the comparison result signal from the comparator.

Furthermore, in the internal power voltage generating circuit, the second reference voltage is equal to or lower than the first reference voltage, and the third reference voltage is equal to or greater than the second reference voltage.

Here, the first reference voltage, the second reference voltage and the third reference voltage are voltages equal to one another.

A semiconductor memory device according to the second invention is characterized by including the internal power voltage generating circuit.

In the semiconductor memory device, based on a data writing signal or a data reading signal, the semiconductor memory device performs data writing or data reading respectively at a speed faster than a clock cycle rate.

The control means causes the charge share circuit to operate synchronously with the data writing signal and the data reading signal.

Moreover, in the semiconductor memory device, the speed faster than the clock cycle rate is twice the clock cycle rate, namely, a DDR.

A semiconductor device according to the third invention is characterized by including the internal power voltage generating circuit.

Therefore, according to the internal power voltage generating circuit of the invention, when the internal power voltage is lower than the predetermined reference voltage, the switch circuit is turned on, so that the charging capacitor having the initial voltage is connected to the output terminal of the differential amplifier, the charges of the control voltage are transferred to the charging capacitor during the predetermined transfer period, the control voltage is decreased at high speed due to charge sharing, and driving capability of the driving transistor is increased. Thereby, a decrease in the internal power voltage is prevented. Accordingly, an internal power voltage generating circuit can be provided, capable of reading data at high speed compared to the prior art, even in, e.g., a semiconductor memory device that reads data using DDR.

DETAILED DESCRIPTION OF DISCLOSED EMBODIMENTS

Figure 1:
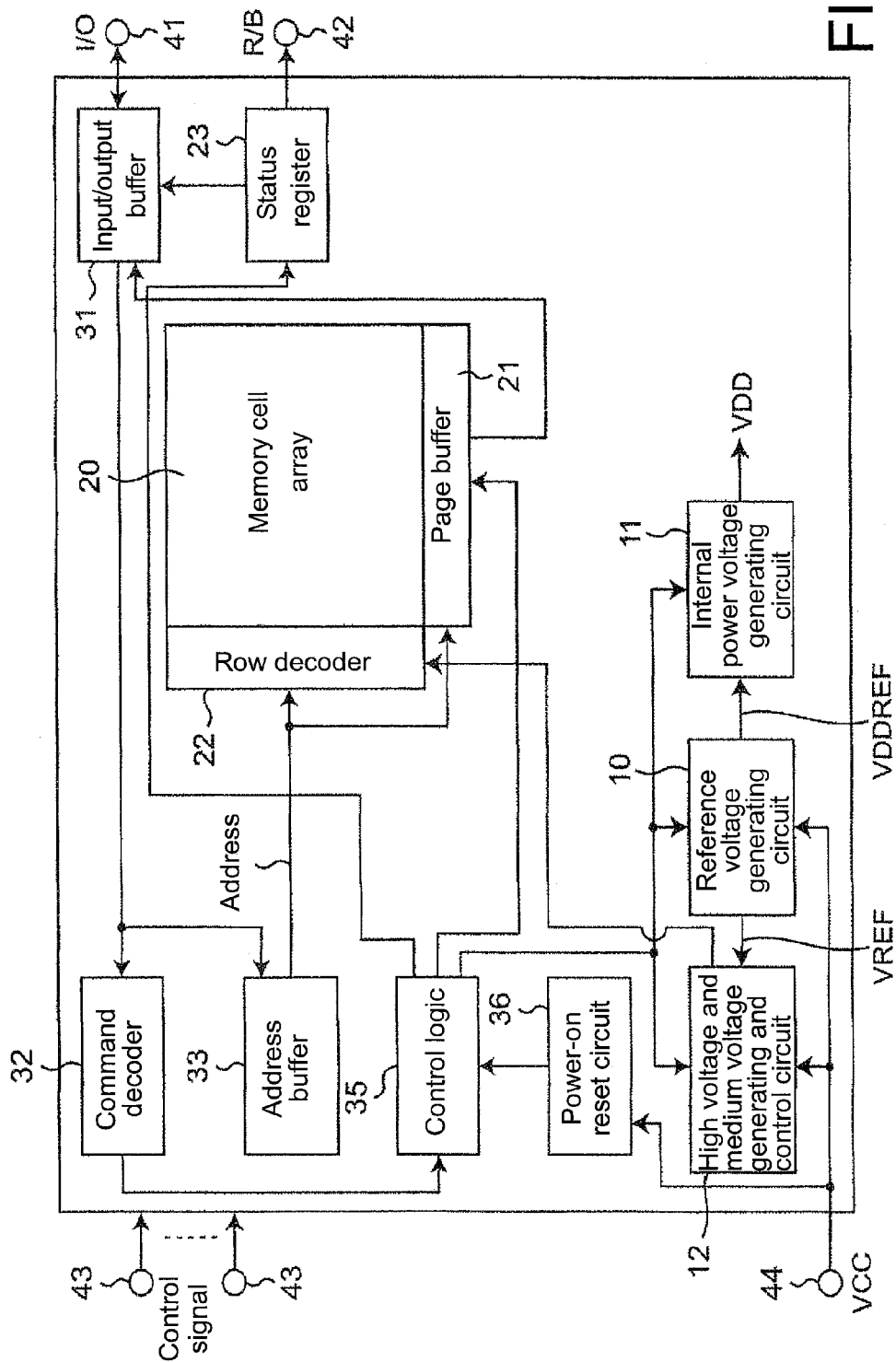
FIG. 1 is a block diagram showing a structure of a non-volatile memory device according to Embodiment 1 of the invention.

The embodiments of the invention are described hereinafter with reference to the drawings. In addition, in the following embodiments, the same constituent elements are denoted by the same reference numerals.

Embodiment 1

FIG. 1 is a block diagram showing a structure of a non-volatile memory device according to Embodiment 1 of the invention. The non-volatile memory device of Embodiment 1 is, e.g., a flash memory, characterized by providing an internal power voltage generating circuit 11. The internal power voltage generating circuit 11 generates, e.g., an internal power voltage VDD for operating at high speed even in performing a DDR operation.

In FIG. 1, the non-volatile memory device includes:

(1) a memory cell array 20, e.g., a flash memory array, storing data;

(2) a page buffer 21, writing data in or reading data out of the memory cell array 20 in unit of pages and outputting the data to an input/output buffer 31, according to a control signal from a control logic 35;

(3) a row decoder 22, for specifying a block and a word line of the memory cell array 20 in response to a specified address;

(4) a status register 23, temporarily storing a status of the non-volatile memory device and outputting the same to the input/output buffer 31 based on a signal from the control logic 35, and generating a ready/busy (R/B) signal and outputting the same to an R/B signal terminal 42;

(5) the input/output buffer 31, temporarily storing data inputted/outputted via an input/output terminal 41;

(6) a command decoder 32, decoding a command from the input/output buffer 31 and outputting decoded command data to the control logic 35;

(7) an address buffer 33, temporarily storing the specified address from the input/output buffer 31;

(8) a power-on reset circuit 36, outputting a reset signal for resetting operations of a semiconductor chip, based on an external power voltage VCC when power is on;

(9) a reference voltage generating circuit 10, generating a predetermined reference voltage VDDREF and a predetermined reference voltage VREF based on the external power voltage VCC applied via an external power voltage terminal 44;

(10) the internal power voltage generating circuit 11, generating an internal power voltage VDD based on the reference voltage VDDREF and supplying the same to each circuit;

(11) a high voltage and medium voltage generating and control circuit 12, generating and outputting a high voltage (HV) and a medium voltage (MV) required for writing (programming) and erasing data, based on the reference voltage VREF; and

(12) the control logic 35, performing a predetermined control over each circuit (including the reference voltage generating circuit 10, the internal power voltage generating circuit 11, and the high voltage and medium voltage generating and control circuit 12) in the non-volatile memory device, based on the command data from the command decoder 32, the control signal inputted via a control signal terminal 43, or the reset signal from the power-on reset circuit 36.

Figure 2:
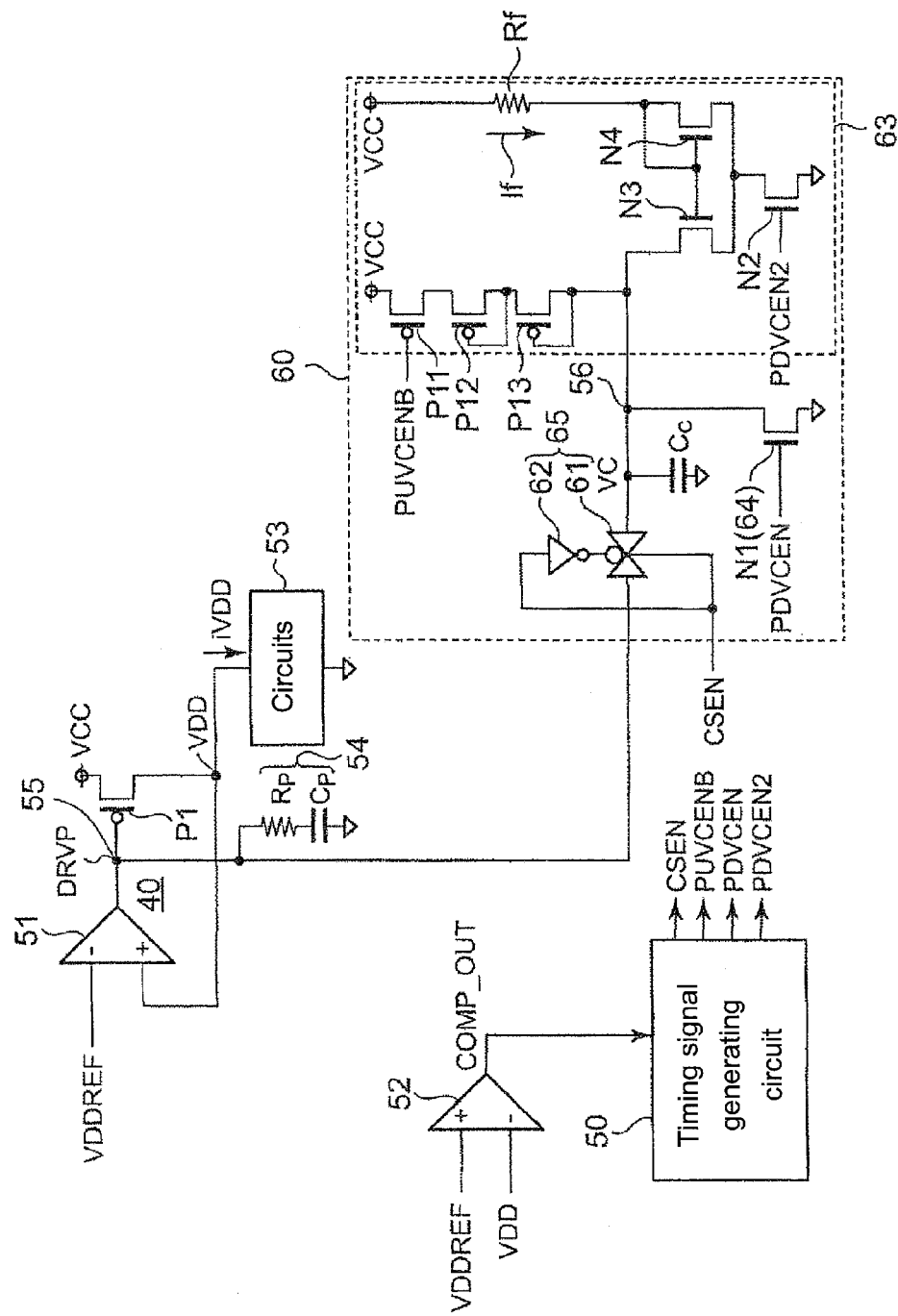
FIG. 2 is a circuit diagram showing a structure of an internal power voltage generating circuit 11 in FIG. 1.
Figure 13:
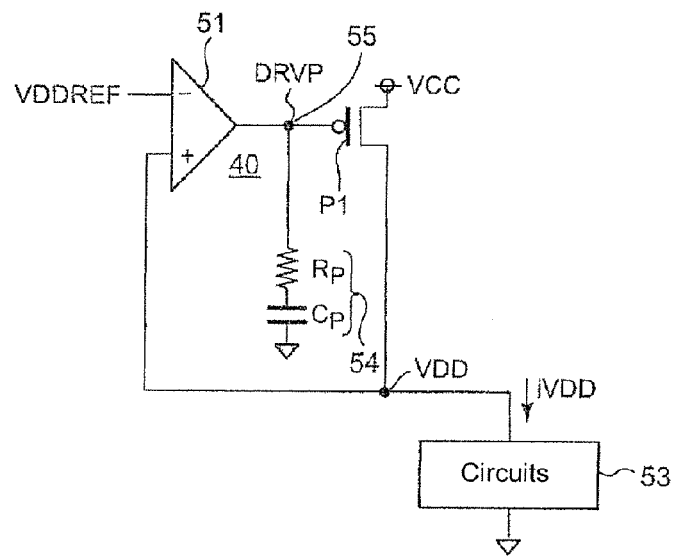
FIG. 13 is a circuit diagram showing the structure of the internal power voltage adjusting circuit 40 according to the conventional example.

FIG. 2 is a circuit diagram showing a structure of the internal power voltage generating circuit 11 in FIG. 1. The internal power voltage generating circuit 11 in FIG. 2 is characterized by further including, in addition to the internal power voltage adjusting circuit 40 in FIG. 13, a comparator 52, a timing signal generating circuit 50 constituting an operation control circuit, and a charge share circuit 60, wherein the internal power voltage adjusting circuit 40 in FIG. 13 includes the differential amplifier 51, the P-channel MOS transistor P1 as a driving transistor, and the phase compensating circuit 54.

In the internal power voltage adjusting circuit 40 in FIG. 2, the reference voltage VDDREF is inputted to the inverting input terminal of the differential amplifier 51. The internal power voltage VDD outputted from the P-channel MOS transistor P1 connected to the external power voltage VCC is inputted to the non-inverting input terminal of the differential amplifier 51. The control voltage (comparison result voltage) from the output terminal of the differential amplifier 51 is applied to the gate of the P-channel MOS transistor P1 via the connection point 55. In addition, the connection point 55 is connected to the phase compensating circuit 54 having the series circuit of the resistor Rp and the capacitor Cp, and the voltage at the connection point 55 is DRVP. In the internal power voltage adjusting circuit 40 configured as above, based on the reference voltage VDDREF, the predetermined internal power voltage VDD is generated from the external power voltage VCC and maintained, and each circuit (load circuit) 53 in the non-volatile memory device is supplied with the power current iVDD.

Figure 3:
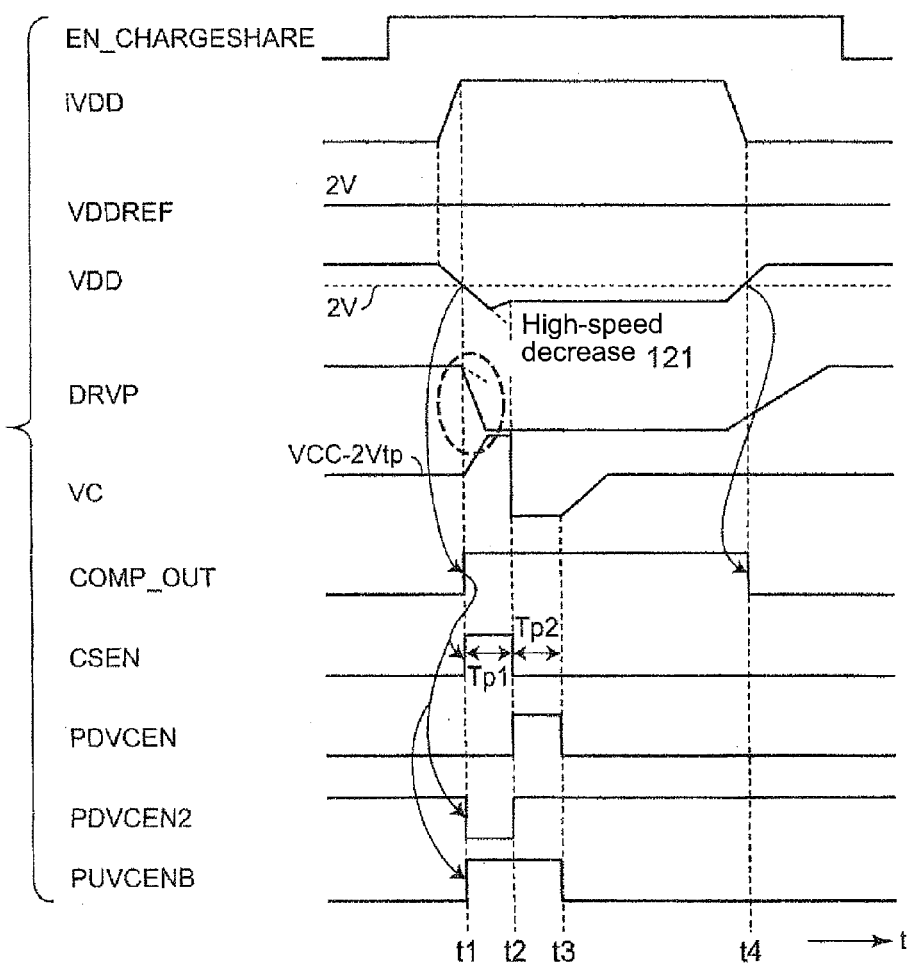
FIG. 3 is a timing chart of signals showing operations of the internal power voltage generating circuit 11 in FIG. 2.

The comparator 52 compares the reference voltage VDDREF with the internal power voltage VDD. When VDDREF>VDD, the comparator 52 outputs a comparison result signal COMP_OUT of a high level to the timing signal generating circuit 50. On the other hand, when VDDREF≤VDD, the comparator 52 outputs the comparison result signal COMP_OUT of a low level to the timing signal generating circuit 50. As shown in FIG. 3, based on the comparison result signal COMP_OUT, the timing signal generating circuit 50 generates and outputs control signals CSEN, PUVCENB, PDVCEN and PDVCEN2.

The charge share circuit 60 is connected to the connection point 55, and controls the voltage DRVP of the connection point 55 based on the control signals CSEN, PUVCENB, PDVCEN and PDVCEN2 from the timing signal generating circuit 50, thereby controlling the internal power voltage VDD. The charge share circuit 60 includes:

(1) a switch circuit 65, including a transfer gate 61 and an inverter 62, turning on/off the connection to the connection point 55 based on the control signal CSEN;

(2) a charging capacitor Cc, connected to the connection point 55 via the switch circuit 65 and a connection point 56, accumulating charges;

(3) a charge reset circuit 64, resetting (discharging) the charges charged in the charging capacitor Cc during a predetermined reset period based on the control signal PDVCEN; and (4) an initial voltage adjusting circuit 63, using the external power voltage VCC to adjust an initial voltage (a voltage of the connection point 56 when the switch circuit 65 and the charge reset circuit 64 are closed before the charges of the control voltage are transferred) of the charging capacitor Cc.

The initial voltage adjusting circuit 63 includes: three P-channel MOS transistors P11 to P13; three N-channel MOS transistors N2 to N4; and a resistor Rf for generating a small current, having a very large resistance value compared to a resistance between a source and a drain of the N-channel MOS transistor N4, the resistance value being, e.g., 10 kΩ to 100 kΩ, etc. The N-channel MOS transistor N3 and the N-channel MOS transistor N4 constitute a current mirror circuit (a size ratio between each of the transistors N3 and N4 may be 1:1 or any other ratio), to which a small current If of e.g., several μA, flows from the external power voltage VCC through the resistor Rf, so that a current corresponding to the small current If flows to circuits of the P-channel MOS transistors P11 to P13. Thereby, an initial voltage of the connection point 56 is adjusted and set. The initial voltage is obtained by subtracting a voltage from the external power voltage VCC, and the voltage is obtained by multiplying a number N (N=2 in the example in FIG. 2) of stages of the P-channel MOS transistors P12 and P13 each formed by connecting a gate and a drain by a threshold voltage Vtp of the P-channel MOS transistors P12 and P13. The initial voltage is a voltage lower than the external power voltage VCC and greater than 0 V.

The charge share circuit 60 configured as above operates based on the control signals CSEN, PUVCENB, PDVCEN and PDVCEN2 from the timing signal generating circuit 50, and controls the voltage of the connection point 55 by sharing the charges associated with the voltage of the connection point 55 by charging of the charging capacitor Cc, so as to control the internal power voltage VDD.

FIG. 3 is a timing chart of signals showing operations of the internal power voltage generating circuit 11 in FIG. 2. In addition, a control signal EN_CHARGESHARE in FIG. 3 is, e.g., a control signal for a DDR operation of a NAND flash memory. Details thereof will be described later in Embodiment 6.

In FIG. 3, the charging capacitor Cc is set at a predetermined initial voltage (VCC−2Vtp) in advance by the initial voltage adjusting circuit 63. When the internal power voltage VDD is lower than the predetermined reference voltage VDDREF (e.g., 2 V) (time t1), the following are generated and outputted:

(1) the control signal CSEN of a high-level pulse with a predetermined time width Tp1;

(2) the control signal PDVCEN2 of a low-level pulse with the predetermined time width Tp1; and (3) the control signal PUVCENB of a high-level pulse with a time width (Tp1+Tp2).

Accordingly, the switch circuit 65 is turned on. The charging capacitor Cc is charged by the charges transferred from the control voltage DRVP of the connection point 55 (transfer period Tp1). After a voltage (voltage of the connection point 56) VC of the charging capacitor Cc is increased from the initial voltage, the switch circuit 65 is turned off at time t2 after the predetermined time Tp1 has elapsed from time t1.

Moreover, an N-channel MOS transistor N1 of the charge reset circuit 64 is turned on. Thereby, the voltage VC of the charging capacitor Cc is decreased to a ground potential. Next, at time t3 after the predetermined time Tp2 has elapsed from time t2, by charges supplied from the initial voltage adjusting circuit 63, the voltage VC starts increasing toward the predetermined initial voltage. Moreover, the load current iVDD is decreased. If the internal power voltage VDD exceeds the reference voltage VREF at time t4, the internal power voltage VDD is also restored to its original value.

In addition, a relationship between the time widths Tp1 and Tp2 may be Tp1=Tp2, or may be Tp1>Tp2 or Tp1<Tp2.

In the above operations of the charge share circuit 60, since the charging capacitor Cc is charged in advance to the predetermined initial voltage lower than the internal power voltage VDD, when the switch circuit 65 is turned on, as shown by 121 in FIG. 3, the voltage DRVP of the connection point 55 can be abruptly decreased at high speed. Once the voltage DRVP is decreased, driving capability of the driving transistor P1 that adjusts/drives the internal power voltage VDD is increased. Accordingly, even if the load current iVDD abruptly increases, an abrupt decrease in the internal power voltage VDD is prevented as shown in FIG. 3, and the internal power voltage VDD can be maintained at a predetermined voltage.

Moreover, a response speed to the load current iVDD can be considerably increased without modification to the internal power voltage adjusting circuit 40 that includes the differential amplifier 51 and the P-channel MOS transistor P1.

Embodiment 2

Figure 4:
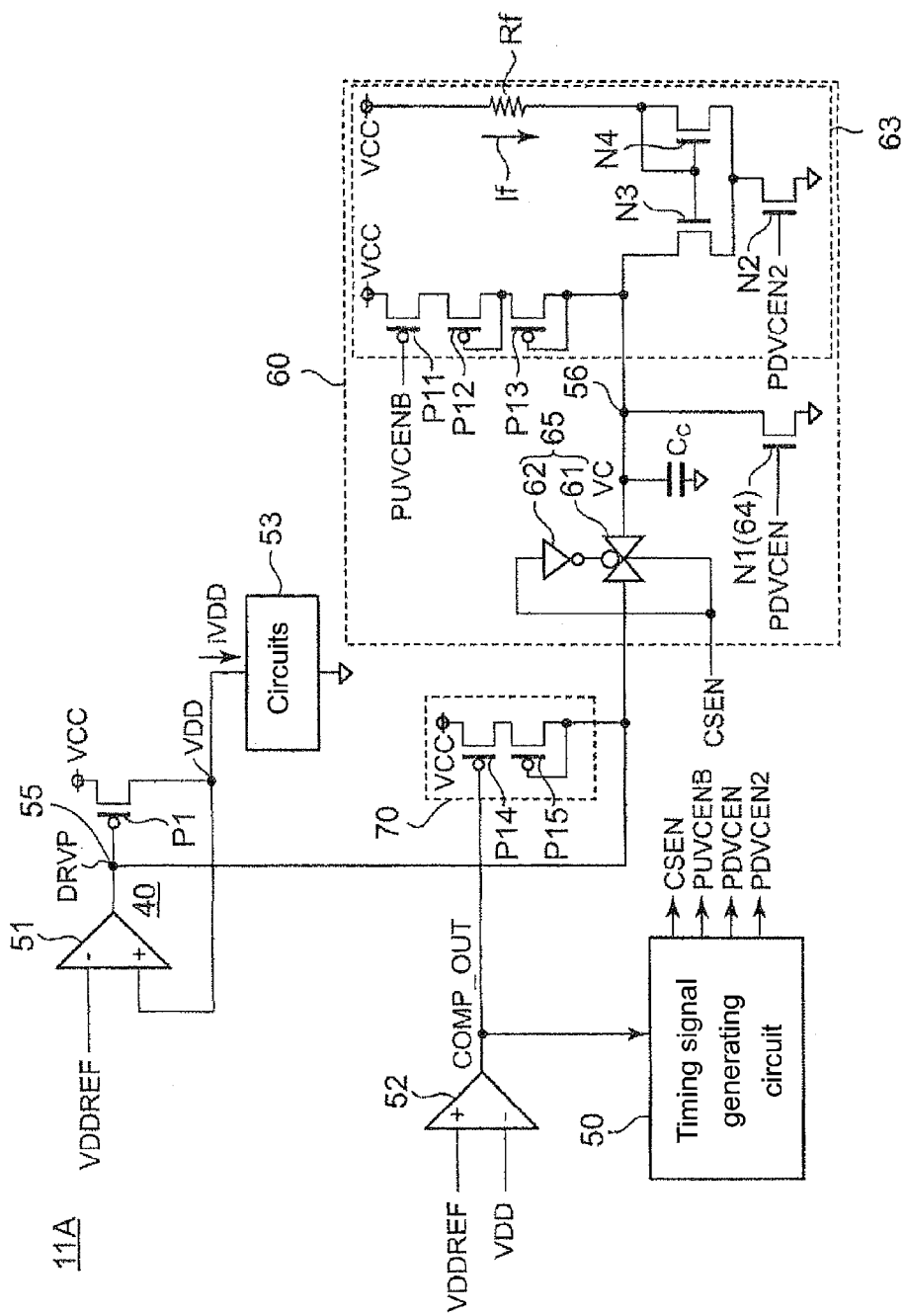
FIG. 4 is a circuit diagram showing a structure of an internal power voltage generating circuit 11A according to Embodiment 2 of the invention.

FIG. 4 is a circuit diagram showing a structure of an internal power voltage generating circuit 11A according to Embodiment 2 of the invention. As shown in FIG. 4, compared to the internal power voltage generating circuit 11 according to Embodiment 1, the internal power voltage generating circuit 11A according to Embodiment 2 differs in the following aspects.

(1) An overshoot prevention circuit 70 is included in place of the phase compensating circuit 54 in FIG. 2.

In FIG. 4, the overshoot prevention circuit 70 is configured by including two P-channel MOS transistors P14 to P15.

Figure 5:
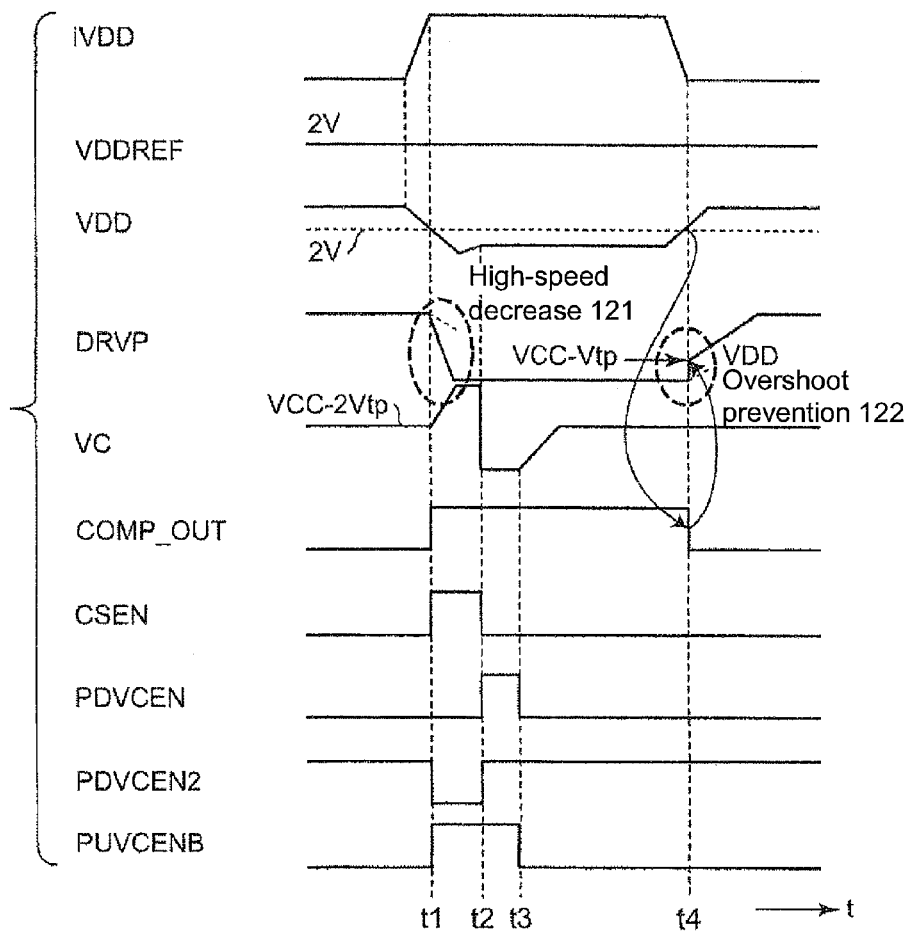
FIG. 5 is a timing chart of signals showing operations of the internal power voltage generating circuit 11A in FIG. 4.

FIG. 5 is a timing chart of signals showing operations of the internal power voltage generating circuit 11A in FIG. 4. In FIG. 5, when the comparison result signal COMP_OUT changes from a high level to a low level (time t4), the overshoot prevention circuit 70 pulls up the voltage DRVP of the connection point 55 from a lowest dropped voltage to a predetermined pull-up voltage (VCC-Vtp in the example in FIG. 4; here, Vtp is a threshold voltage of the P-channel MOS transistor P15). Then, the voltage is restored to its original voltage value, and thereby the operations of the P-channel MOS transistor P1 operated by the control voltage DRVP are properly suppressed, so that an overshoot of the internal power voltage VDD can be prevented. At time t4, when the response speed is slow and the voltage is slowly increased as shown by the control voltage DRVP in FIG. 3, there is a possibility that an overshoot might occur in the internal power voltage VDD. Thus, as shown in FIG. 5, at time t4, the control voltage DRVP is pulled up at high speed and thereby a driving force of the driving transistor P1 is reduced, so that the overshoot of the internal power voltage VDD can be suppressed.

As explained above, according to the present embodiment, in addition to achievement of the effects of Embodiment 1, the overshoot of the internal power voltage VDD can be prevented by inclusion of the overshoot prevention circuit 70.

In the above Embodiment 1 and Embodiment 2, the reference voltage VDDREF of the comparator 52 that determines whether to turn on/off the operations of the charge share circuit 60 or the overshoot prevention circuit 70 is the same voltage as the reference voltage VDDREF of the differential amplifier 51 of the internal power voltage adjusting circuit 40 that adjusts/drives the internal power voltage. This is an ideal situation. However, as in the present embodiment where a timing control is applied, in practice, oscillation might also occur due to a voltage error or a timing error, noise and so on. Therefore, it is safe to set a difference between the reference voltages. If the reference voltage of the differential amplifier 51 of the internal power voltage adjusting circuit 40 is set as a first reference voltage, the reference voltage of the comparator 52 of the charge share circuit 60 is set as a second reference voltage, and the reference voltage of a comparator (which needs to be additionally disposed) of the overshoot prevention circuit 70 is set as a third reference voltage, according to requirements of the above operations, the second reference voltage is set lower than the first reference voltage, and the third reference voltage is set equal to or greater than the second reference voltage. For example, the second reference voltage is set 0 to 0.1 V lower than the first reference voltage, and the third reference voltage is set close to the first reference voltage, e.g., 0 to 0.05 V higher or lower than the first reference voltage. Moreover, of course, this also applies to the embodiments hereinafter.

Embodiment 3

Figure 6:
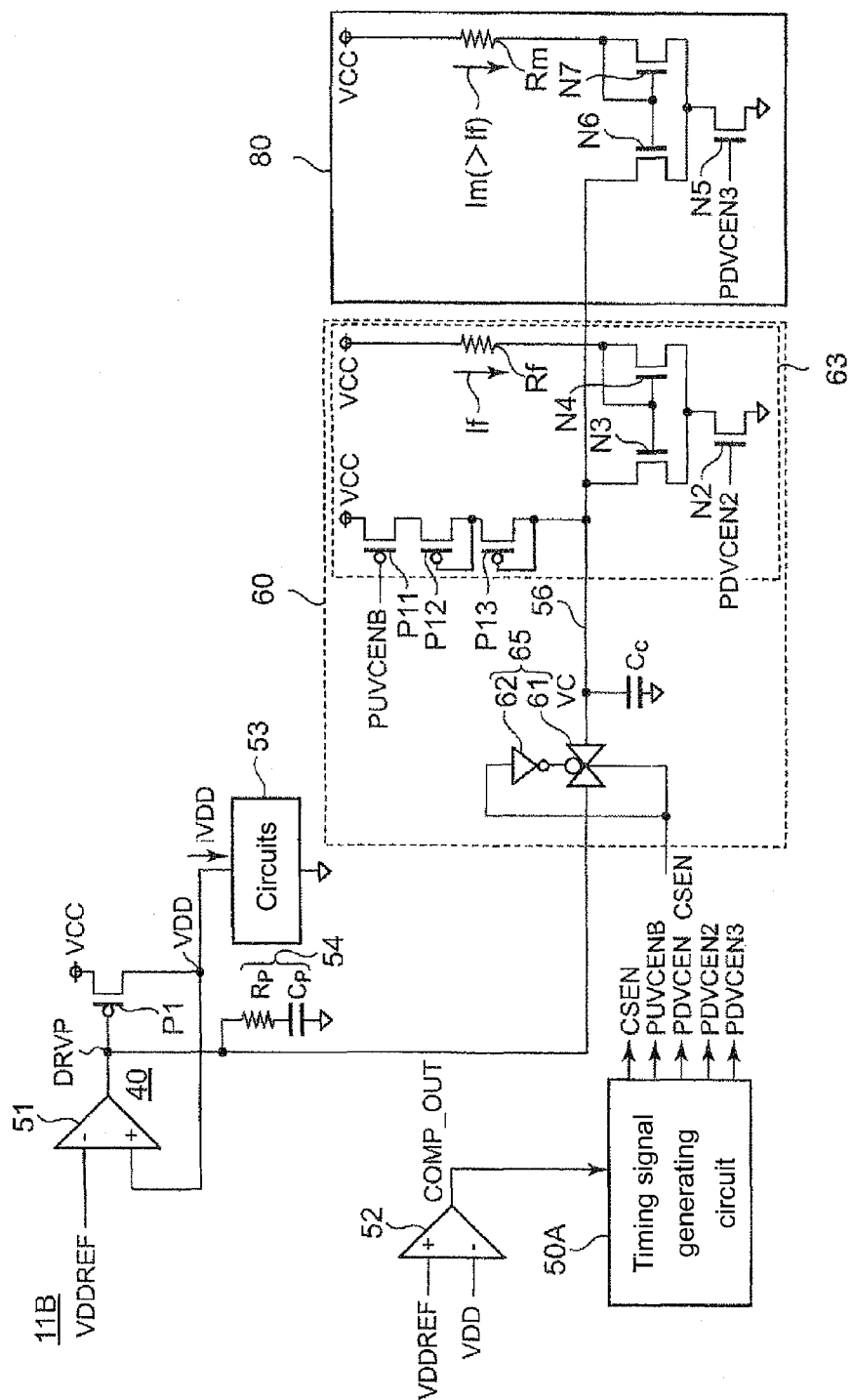
FIG. 6 is a circuit diagram showing a structure of an internal power voltage generating circuit 11B according to Embodiment 3 of the invention.

FIG. 6 is a circuit diagram showing a structure of an internal power voltage generating circuit 11B according to Embodiment 3 of the invention. As shown in FIG. 6, compared to the internal power voltage generating circuit 11 according to Embodiment 1, the internal power voltage generating circuit 11B according to Embodiment 3 differs in the following aspects.

(1) A pull-down circuit 80 is included in place of the charge reset circuit 64.

(2) A timing signal generating circuit 50A that further generates a control signal PDVCEN3 is included in place of the timing signal generating circuit 50.

In FIG. 6, the pull-down circuit 80 is configured by including a resistor Rm for generating a small current, and three N-channel MOS transistors N5 to N7, wherein the resistor Rm for generating a small current is configured to cause a small current Im (>If) for discharge of, e.g., about several mA to several tens of mA, to flow.

Figure 7:
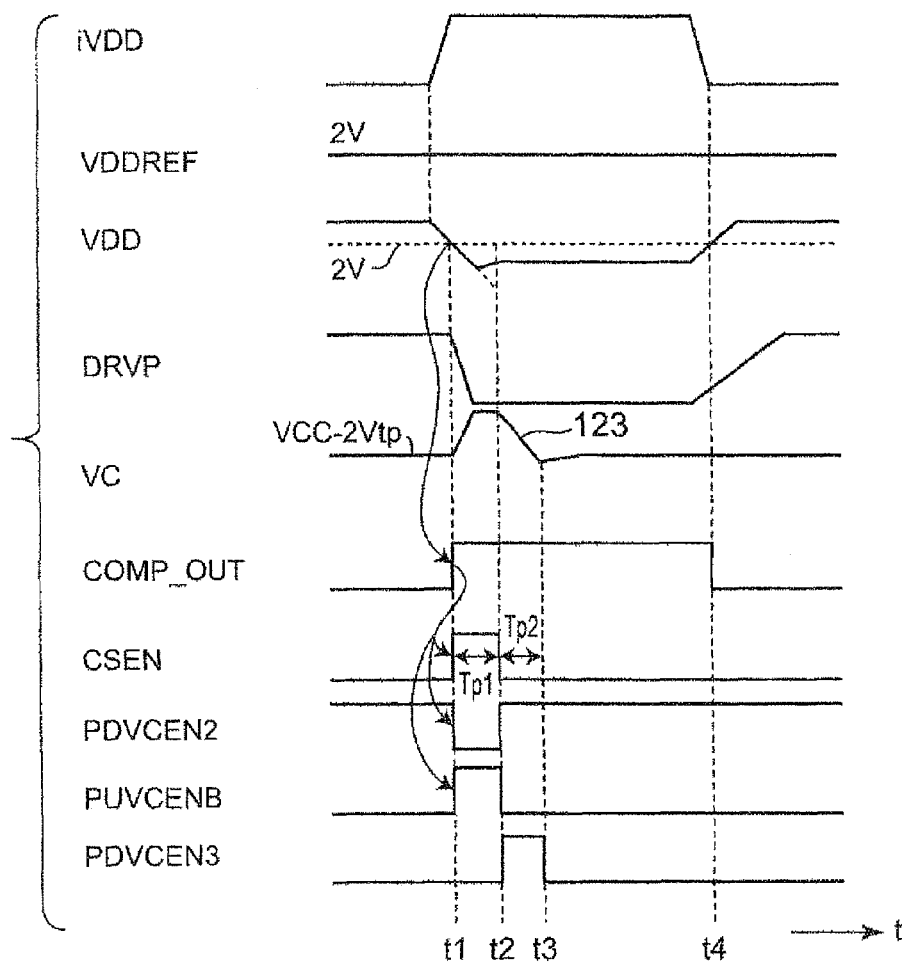
FIG. 7 is a timing chart of signals showing operations of the internal power voltage generating circuit 11B in FIG. 6.

FIG. 7 is a timing chart of signals showing operations of the internal power voltage generating circuit 11B in FIG. 6. The N-channel MOS transistor N6 and the N-channel MOS transistor N7 constitute a current mirror circuit. The control signal PDVCEN3 becomes a high-level pulse signal during the predetermined period Tp2 starting from time t2. During the period (time t2 to time t3), since the pull-down circuit 80 is turned on, a current of the N-channel MOS transistor N6 corresponding to the small current Im flows from the charging capacitor Cc to ground, so that the voltage of the connection point 56 is gradually pulled down (123 in FIG. 7).

In addition, the relationship between the time widths Tp1 and Tp2 may be Tp1=Tp2, or may be Tp1>Tp2 or Tp1<Tp2.

As explained above, according to Embodiment 3, in addition to achievement of the effects of Embodiment 1, the charges of the charging capacitor Cc can be discharged by inclusion of the pull-down circuit 80 in place of the charge reset circuit 64.

Embodiment 4

Figure 8:
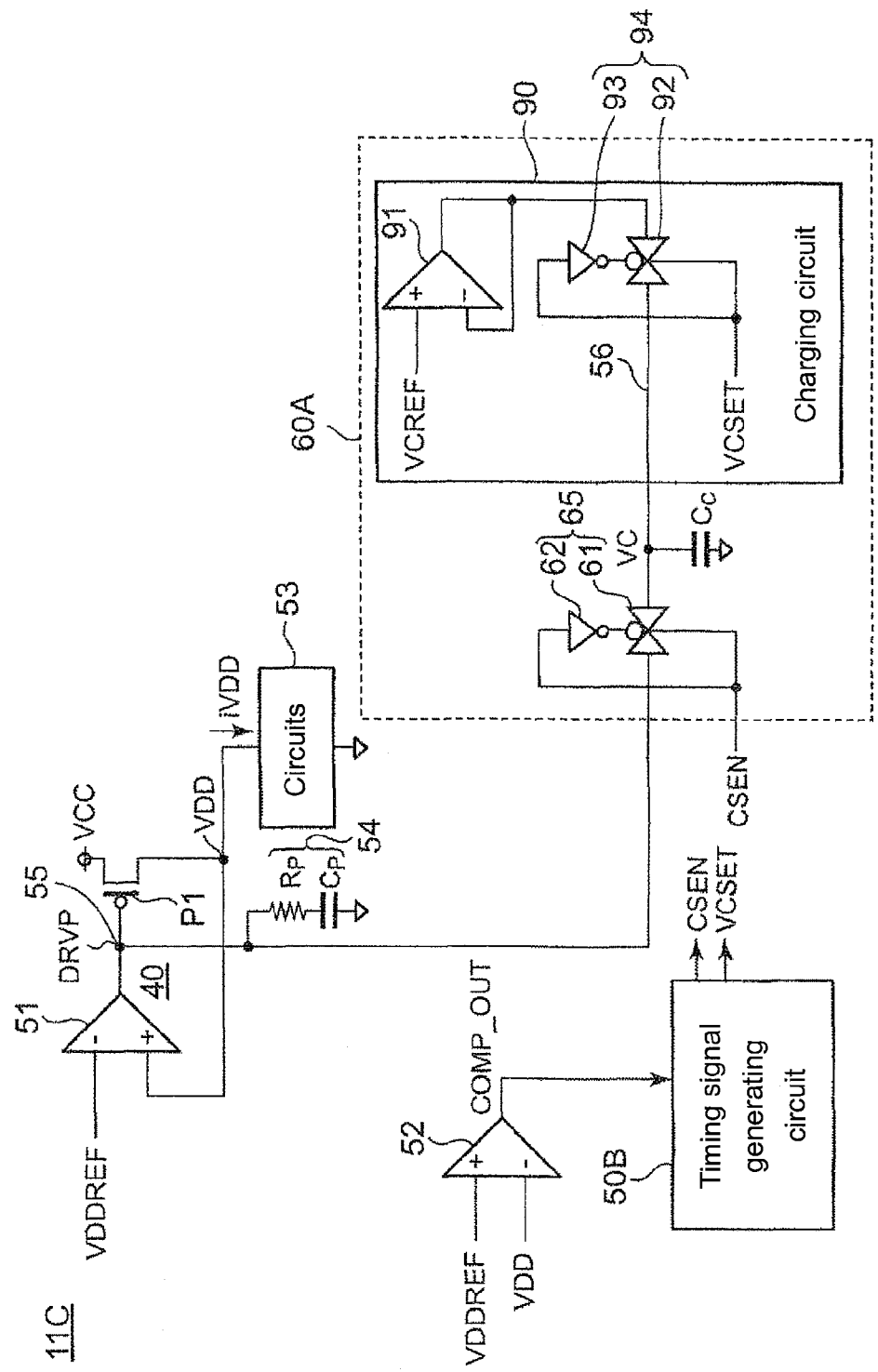
FIG. 8 is a circuit diagram showing a structure of an internal power voltage generating circuit 11C according to Embodiment 4 of the invention.

FIG. 8 is a circuit diagram showing a structure of an internal power voltage generating circuit 11C according to Embodiment 4 of the invention. As shown in FIG. 8, compared to the internal power voltage generating circuit 11 according to Embodiment 1, the internal power voltage generating circuit 11C according to Embodiment 4 differs in the following aspects.

(1) A charge share circuit 60A is included in place of the charge share circuit 60. Here, the charge share circuit 60A replaces the charge reset circuit 64 and the initial voltage adjusting circuit 63, and includes a charging circuit 90.

(2) A timing signal generating circuit 50B that generates control signals CSEN and VCSET is included in place of the timing signal generating circuit 50.

In FIG. 8, the charging circuit 90 includes:

(1) a differential amplifier 91, constituting a voltage follower circuit (buffer circuit); and (2) a switch circuit 94, inserted between the connection point 56 and the differential amplifier 91, including a transfer gate 92 and an inverter 93.

An output terminal of the differential amplifier 91 is connected to an inverting input terminal thereof. A predetermined charging reference voltage VCREF (generated by, e.g., a later-described charging reference voltage generating circuit 120 in FIG. 9) is inputted to a non-inverting input terminal of the differential amplifier 91, and the output terminal of the differential amplifier 91 is applied to the charging capacitor Cc via the switch circuit 94 and the connection point 56. For example, before time t1 and after time t2 in FIG. 3, the switch circuit 94 is turned on. Thereby, the voltage of the connection point 56 is set to the charging reference voltage VCREF (e.g., a voltage equivalent to about VCC−2Vtp; the charging reference voltage being a voltage lower than the external power voltage VCC and greater than 0 V) to replace the initial voltage of Embodiment 1. Thereby, similarly to the charge share circuit 60 of Embodiment 1, by transfer of the charges of the charging capacitor Cc, the voltage DRVP of the connection point 55 can be abruptly decreased at high speed. Accordingly, even if the load current iVDD abruptly increases, an abrupt decrease in the internal power voltage VDD is prevented as shown in FIG. 3, and the internal power voltage VDD can be maintained at a predetermined voltage.

Figure 9:
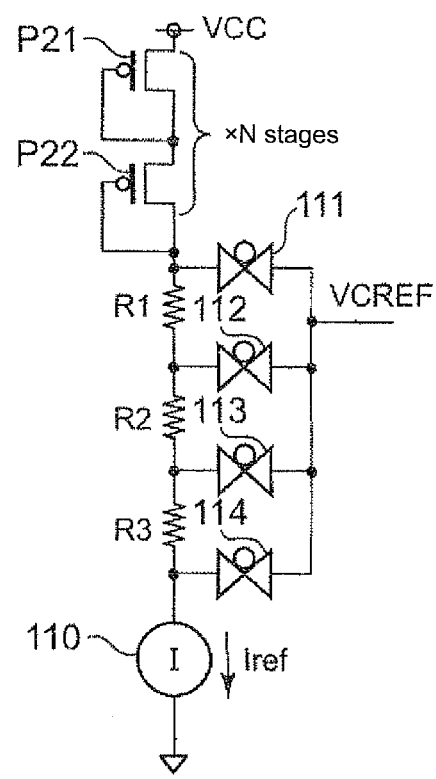
FIG. 9 is a circuit diagram showing a structure of a charging reference voltage generating circuit 120 that generates a charging reference voltage VCREF in FIG. 8.

FIG. 9 is a circuit diagram showing a structure of the charging reference voltage generating circuit 120 that generates a charging reference voltage VCREF in FIG. 8. In FIG. 9, a series circuit including two-stage P-channel MOS transistors P21 and P22 (or a series circuit including a plurality of N stages), divider resistors R1, R2 and R3, and a reference current source 110 is inserted between the external power voltage VCC and a ground voltage. Transfer gates 111~114 are connected to both ends of each of the divider resistors R1, R2 and R3, which becomes an output circuit of the charging reference voltage VCREF. In the series circuit, a reference current Iref flows through, and any one of the transfer gates 111~114 is turned on. Thereby, a voltage is selected and outputted as the charging reference voltage VCREF as described below.

(1) When the transfer gate 111 is turned on, a voltage (VCC−N×Vtp) as described below is outputted as the charging reference voltage VCREF. The voltage (VCC−N×Vtp) is obtained by subtracting, from the external power voltage VCC, a voltage (a number N corresponding to the number of stages of the P-channel MOS transistors P21 and P22)×(their threshold voltage Vtp).

(2) When the transfer gate 112 is turned on, a voltage (VCC−N×Vtp−Iref×R1) as described below is outputted as the charging reference voltage VCREF. The voltage (VCC−N×Vtp−Iref×R1) is obtained by subtracting, from the voltage (VCC−N×Vtp), a voltage drop Iref×R1 of the resistor R1.

(3) When the transfer gate 113 is turned on, a voltage (VCC−N×Vtp−Iref×(R1+R2)) as described below is outputted as the charging reference voltage VCREF. The voltage (VCC−N×Vtp−Iref×(R1+R2)) is obtained by subtracting, from the voltage (VCC−N×Vtp), a voltage drop Iref×(R1+R2) of the resistors R1 and R2.

(4) When the transfer gate 114 is turned on, a voltage (VCC−N×Vtp−Iref×(R1+R2+R3)) as described below is outputted as the charging reference voltage VCREF. The voltage (VCC−N×Vtp−Iref×(R1+R2+R3)) is obtained by subtracting, from the voltage (VCC−N×Vtp), a voltage drop Iref×(R1+R2+R3) of the resistors R1, R2 and R3.

Embodiment 5

Figure 10:
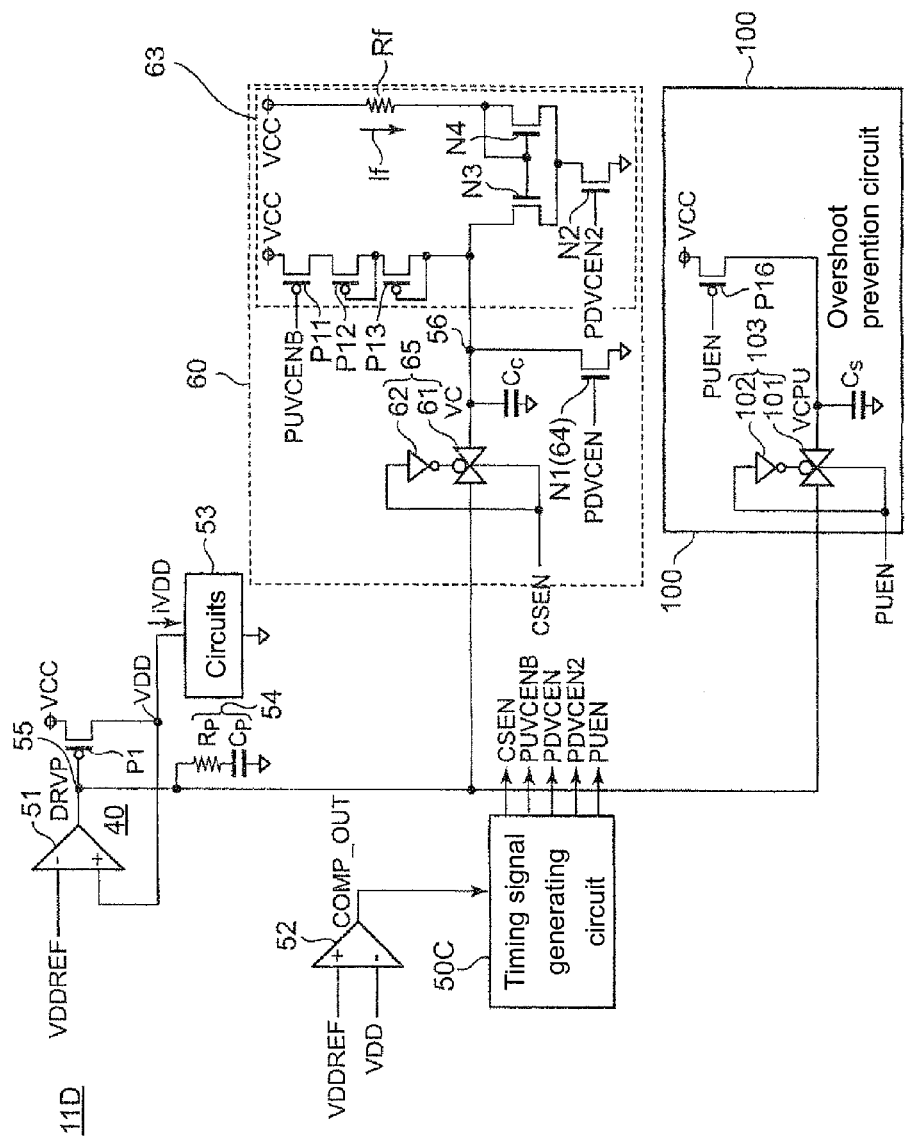
FIG. 10 is a circuit diagram showing a structure of an internal power voltage generating circuit 11D according to Embodiment 5 of the invention.

FIG. 10 is a circuit diagram showing a structure of an internal power voltage generating circuit 11D according to Embodiment 5 of the invention. As shown in FIG. 10, compared to the internal power voltage generating circuit 11 according to Embodiment 1, the internal power voltage generating circuit 11D according to Embodiment 5 differs in the following aspects.

(1) An overshoot prevention circuit 100 is further included.
(2) A timing signal generating circuit 50C that further generates a control signal PUEN is included in place of the timing signal generating circuit 50.

In FIG. 10, the overshoot prevention circuit 100 includes:
(1) a P-channel MOS transistor P16, turned on/off based on the control signal PUEN;
(2) the charging capacitor Cs; and
(3) a switch circuit 103, including a transfer gate 101 and an inverter 102.

Figure 11:
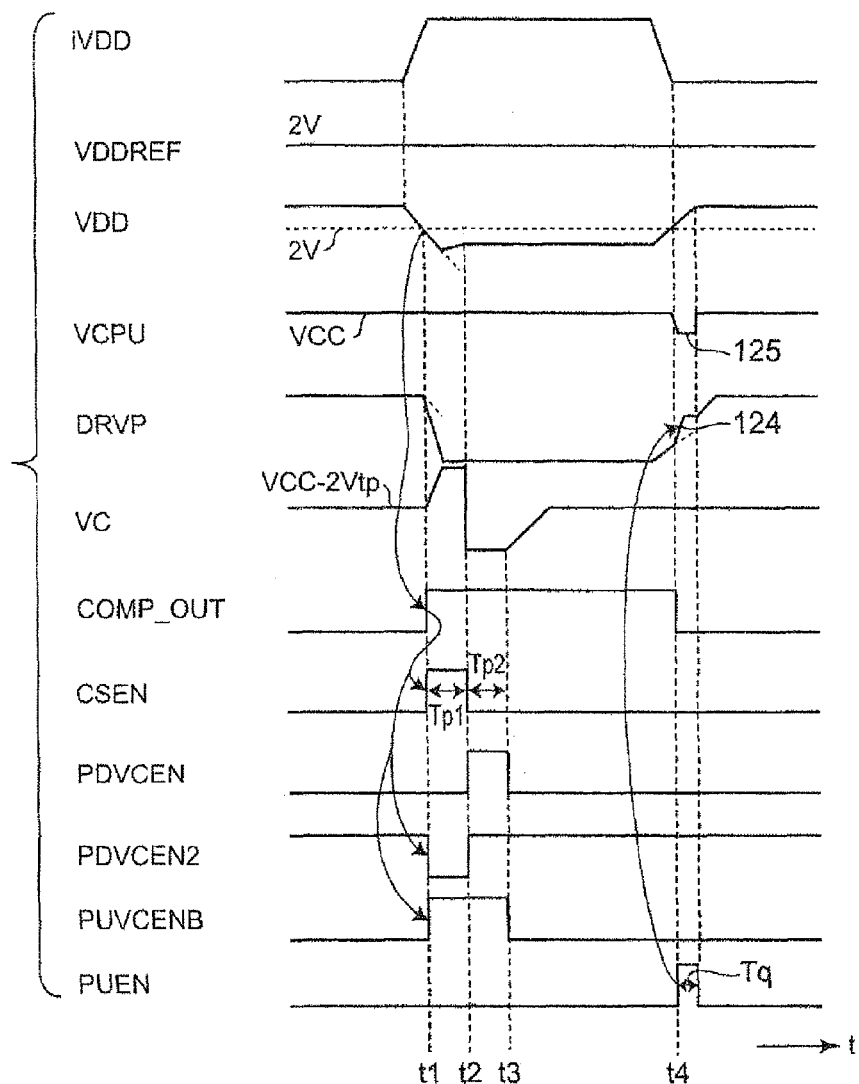
FIG. 11 is a timing chart of signals showing operations of the internal power voltage generating circuit 11D in FIG. 10.

FIG. 11 is a timing chart of signals showing operations of the internal power voltage generating circuit 11D in FIG. 10. In FIG. 11, the operations from time t1 until time t4 are the same as those in Embodiment 1. However, at time t4, the timing signal generating circuit 50C generates a high-level pulse of a predetermined period Tq, namely, the control signal PUEN. Accordingly, the overshoot prevention circuit 100 is turned on, so that a charging voltage VCPU of the charging capacitor Cs charged by the external power voltage VCC in advance is connected to the control voltage DRVP of the connection point 55 during the period Tq, and the overshoot of the internal power voltage VDD can be prevented (124 in FIG. 11). When the control signal PUEN is generated, the charging voltage VCPU is decreased a little, and the control voltage DRVP is increased a little (125 in FIG. 11). Due to the increase in the control voltage DRVP, the operations of the driving transistor P1 are suppressed and the internal power voltage VDD is prevented from overshooting.

In addition, the relationship between the time widths Tp1 and Tp2 may be Tp1=Tp2, or may be Tp1>Tp2 or Tp1<Tp2.

As explained above, in the present embodiment, in addition to achievement of the effects of Embodiment 1, the overshoot of the internal power voltage VDD can be prevented by inclusion of the overshoot prevention circuit 100 in place of the overshoot prevention circuit 70 according to Embodiment 2.

Embodiment 6

Figure 12:
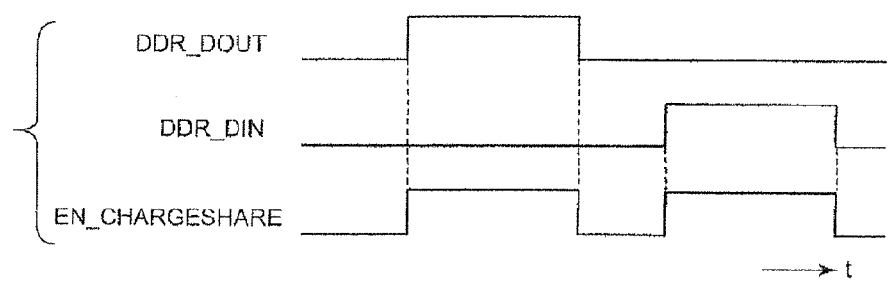
FIG. 12 is a timing chart showing operations of an internal power voltage generating circuit for a DDR flash memory according to Embodiment 6 of the invention.

FIG. 12 is a timing chart showing operations of an internal power voltage generating circuit for a DDR flash memory according to Embodiment 6 of the invention. The control signal EN_CHARGESHARE in FIG. 12 is a control signal generated by the timing signal generating circuit 50 in FIG. 2 and so on for a DDR operation of e.g., a NAND flash memory. Moreover, the control signal EN_CHARGESHARE is generated synchronously with a data write signal DDR_DIN or a read signal DDR_DOUT of DDR operation. The control signal EN_CHARGESHARE is generated by, e.g., the control logic 35 in FIG. 1 shown in Embodiment 1, or, e.g., the timing signal generating circuits 50 to 50C of the embodiments, and an operation timing thereof is e.g., as shown in FIG. 3. Therefore, the circuits of Embodiments 1 to 5 can be applied to a DDR flash memory.

Here, in Embodiments 1 to 5, in practice, a trigger for the starting of the operations of the charge share circuit 60 or the overshoot prevention circuit 70 and so on is an increase in the load current iVDD and a decrease in the internal power voltage VDD. However, these not only occur at DDR but generally occur in ordinary operation. Thus, in distinction from the above, the control signal EN_CHARGESHARE is used for operation with a large load current generated in a DDR operation.

Therefore, in addition to a DDR operation, if there is any other operation that similarly causes flow of a large load current, by a timing control signal corresponding thereto is brought in the timing signal generating circuit 50 and so on, the internal power voltage generating circuit of the invention can be operated.

In addition, during writing or reading of data using DDR, by use of both rising and falling of a clock, the data is transferred at double data rate being twice a data transfer speed of an ordinary memory that transfers data at a rising or falling of the clock (single data rate; SDR) (clock cycle rate). The invention is not limited thereto, and is also applicable to a semiconductor memory device that transfers data at a speed faster than the clock cycle rate.

In the above embodiments, the internal power voltage generating circuit for a semiconductor non-volatile memory device such as a flash memory is explained. However, the invention is not limited thereto, and is also applicable to various semiconductor memory devices such as semiconductor volatile memory devices such as dynamic random access memory (DRAM), synchronous dynamic random access memory (SDRAM) and so on, and semiconductor devices such as semiconductor integrated circuits and so on having a processor and so on. Moreover, the invention is not limited to application in a NAND flash memory, but is also applicable to a NOR flash memory.

As described in detail as above, according to the internal power voltage generating circuit of the invention, by inclusion of a charge share circuit, a power voltage generating circuit can be provided, capable of reading data at high speed compared to the prior art, even in, e.g., a semiconductor memory device that reads data using DDR.

What is claimed is:

1. An internal power voltage generating circuit, comprising: a differential amplifier, comparing an internal power voltage supplied to a load circuit with a predetermined first reference voltage and outputting from an output terminal a control voltage showing a comparison result; and a driving transistor, driving an external power voltage according to the control voltage and outputting the internal power voltage, wherein the internal power voltage generating circuit is adjusted such that the internal power voltage becomes the first reference voltage, wherein the internal power voltage generating circuit further comprises:

a charge share circuit, comprising a charging capacitor, an initial voltage adjusting circuit and a charge reset circuit, wherein the charging capacitor is connected to the output terminal of the differential amplifier via a switch circuit, and is charged by charges of the control voltage, the initial voltage adjusting circuit adjusts and applies a predetermined initial voltage to the charging capacitor, and the charge reset circuit discharges the charging capacitor; and a control means, turning on the switch circuit when the internal power voltage is lower than a predetermined second reference voltage, thereby connecting the charging capacitor having the initial voltage to the output terminal of the differential amplifier, transferring the charges of the control voltage to the charging capacitor during a predetermined transfer period, then turning off the switch circuit, and then transferring the charges of the charging capacitor by the charge reset circuit during a predetermined reset period.

2. The internal power voltage generating circuit of claim 1, wherein
the initial voltage adjusting circuit generates a predetermined small current and causes a current corresponding to the small current to a circuit so as to generate the initial voltage, wherein the circuit generates the predetermined initial voltage decreasing from the external power voltage.

3. The internal power voltage generating circuit of claim 2, wherein
the initial voltage adjusting circuit comprises a predetermined number of stages of first transistors, the predetermined number of stages of first transistors are connected to the external power voltage and connected to each other in series, and the initial voltage adjusting circuit generates a voltage as the initial voltage, wherein the voltage is obtained by subtracting, from the external power voltage, a value obtained by multiplying the predetermined number of stages by a threshold voltage of the first transistor.

4. The internal power voltage generating circuit of claim 1, wherein
the initial voltage adjusting circuit comprises a circuit formed by connecting a predetermined number of stages of second transistors, a plurality of divider resistors and a reference current source in series, the predetermined number of stages of second transistors are connected to the external power voltage and connected to each other in series, and the initial voltage adjusting circuit is a charging circuit that selectively generates, as the initial voltage, a voltage from one end of any one of the plurality of divider resistors.

5. The internal power voltage generating circuit of claim 1, wherein
the charge reset circuit comprises a third transistor connected between the charging capacitor and ground, and during the reset period, the third transistor is turned on, and thereby the charges of the charging capacitor are discharged.

6. The internal power voltage generating circuit of claim 1, wherein
the charge reset circuit is a pull-down circuit that, during the reset period, causes a predetermined small current for discharge to flow, and causes a current corresponding to the small current for discharge to flow from the charging capacitor to discharge the charges of the charging capacitor, thereby pulling down a voltage of the charging capacitor.

7. The internal power voltage generating circuit of claim 4, wherein
during the reset period, the charge reset circuit transfers the charges of the charging capacitor in a manner that a potential of the control voltage is reduced by being set to a predetermined charging reference voltage.

8. The internal power voltage generating circuit of claim 1, wherein
the second reference voltage is equal to the first reference voltage.

9. The internal power voltage generating circuit claim 1, further comprising:
an overshoot prevention circuit, pulling up the control voltage to a predetermined voltage when the internal power voltage is greater than a predetermined third reference voltage, thereby preventing an overshoot of the internal power voltage.

10. The internal power voltage generating circuit of claim 9, wherein
when the internal power voltage is greater than the predetermined third reference voltage, the overshoot prevention circuit pulls up the control voltage to a voltage decreasing from the external power voltage by a predetermined voltage via a transistor circuit, thereby preventing the overshoot of the internal power voltage.

11. The internal power voltage generating circuit of claim 9, wherein
when the internal power voltage is greater than the predetermined third reference voltage, the overshoot prevention circuit connects the control voltage to a charging voltage for a predetermined period for charge sharing, thereby preventing the overshoot of the internal power voltage, wherein the charging voltage is obtained by charging the external power voltage to another charging capacitor.

12. The internal power voltage generating circuit of claim 1, wherein
the control means comprises:
a comparator, comparing the internal power voltage with the second reference voltage and outputting a comparison result signal; and
a timing signal generating circuit, generating a control signal that controls on or off of the switch circuit based on the comparison result signal from the comparator.

13. The internal power voltage generating circuit of claim 8, wherein
the second reference voltage is equal to or lower than the first reference voltage, and the third reference voltage is equal to or greater than the second reference voltage.

14. The internal power voltage generating circuit of claim 13, wherein
the first reference voltage, the second reference voltage and the third reference voltage are voltages equal to one another.

15. A semiconductor memory device, comprising the internal power voltage generating circuit of claim 1.

16. The semiconductor memory device of claim 15, wherein
based on a data writing signal or a data reading signal, the semiconductor memory device performs data writing or data reading respectively at a speed faster than a clock cycle rate, and
the control means causes the charge share circuit to operate synchronously with the data writing signal and the data reading signal.

17. The semiconductor memory device of claim 16, wherein the speed faster than the clock cycle rate is twice the clock cycle rate, namely, a double data rate (DDR).

18. A semiconductor device, comprising the internal power voltage generating circuit of claim 1.

* * * * *